(12) United States Patent
Kan

(10) Patent No.: US 8,781,427 B1
(45) Date of Patent: Jul. 15, 2014

(54) SIGNAL RECEIVING CIRCUIT AND THE RELATED SIGNAL RECEIVING METHOD

(71) Applicant: Rafael microelectronics, Inc., Hsinchu (TW)

(72) Inventor: Meng-Ping Kan, Hsinchu (TW)

(73) Assignee: Rafael microelectronics, Inc., Hsinchu (TW)

( * ) Notice: Subject to any disclaimer, the term of this patent is extended or adjusted under 35 U.S.C. 154(b) by 0 days.

(21) Appl. No.: 13/792,244

(22) Filed: Mar. 11, 2013

(51) Int. Cl.
*H04B 1/16* (2006.01)
*H03G 3/20* (2006.01)

(52) U.S. Cl.
CPC ........................................ *H03G 3/20* (2013.01)
USPC .................................................... 455/234.1

(58) Field of Classification Search
USPC .......... 455/232.1, 234.1, 234.2, 245.2, 247.1, 455/249.1, 334, 339, 341
See application file for complete search history.

(56) References Cited

U.S. PATENT DOCUMENTS

| 8,428,536 B2* | 4/2013 | Khoini-Poorfard et al. ........................ 455/234.2 |
| 2011/0076977 A1* | 3/2011 | Coban et al. ............... 455/234.2 |
| 2011/0294448 A1* | 12/2011 | Vauhkonen ................ 455/232.1 |

* cited by examiner

*Primary Examiner* — Blane J Jackson
(74) *Attorney, Agent, or Firm* — Winston Hsu; Scott Margo

(57) ABSTRACT

A signal receiving circuit includes an amplifier, a mixer, and a first controlling circuit. The amplifier includes: an input stage for receiving an input signal to generate a first signal; a gain stage coupled to the input stage for generating an output signal according to the first signal; and an output stage coupled to the gain stage for adjusting a spectral response of the amplifier according to a first adjusting signal. The mixer is coupled to the gain stage for generating a converted signal according to the output signal. The first controlling circuit is coupled to the mixer for detecting the converted signal to generate the first adjusting signal to adjust the spectral response of the amplifier.

17 Claims, 10 Drawing Sheets

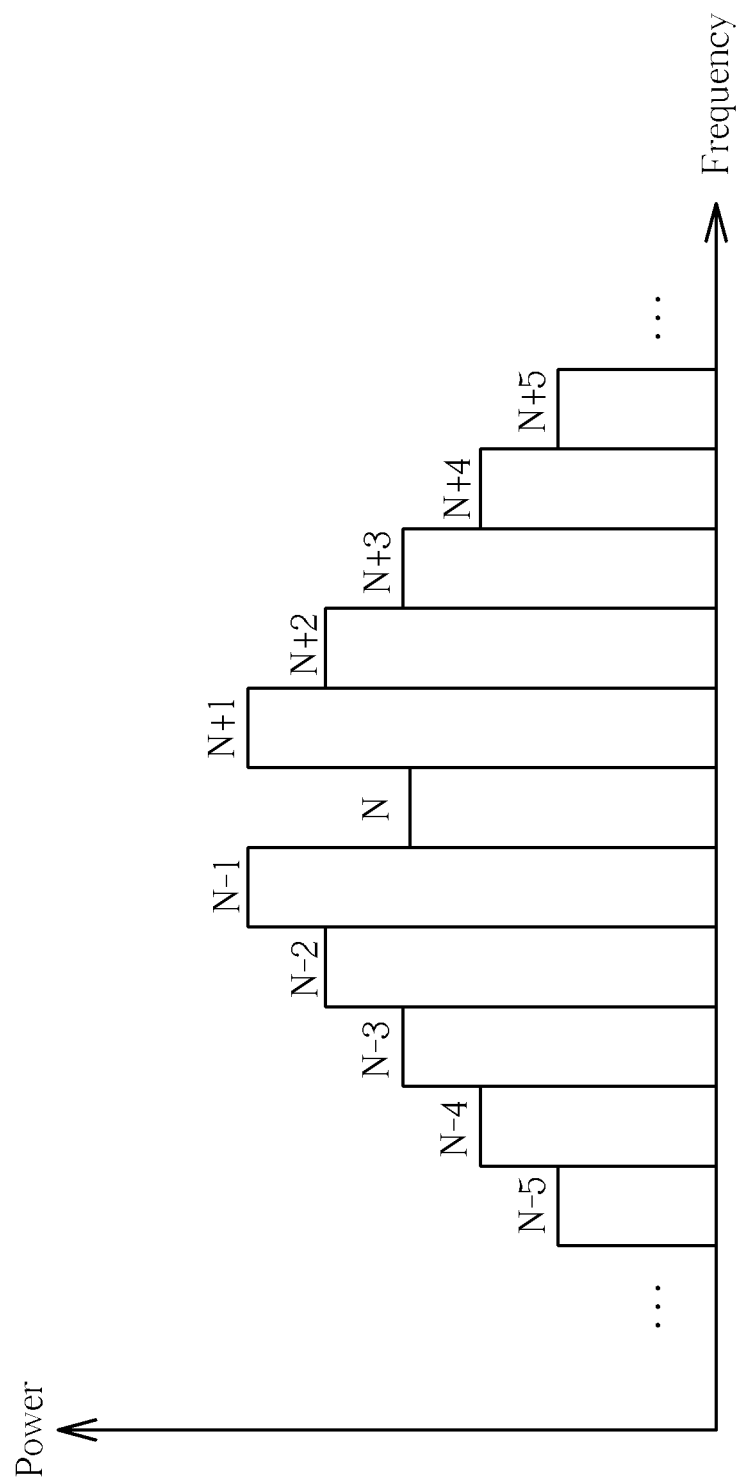

US 8,781,427 B1

SIGNAL RECEIVING CIRCUIT AND THE RELATED SIGNAL RECEIVING METHOD

BACKGROUND OF THE INVENTION

1. Field of the Invention

The present invention relates to a signal receiving circuit and a related signal receiving method, and more particularly to a broadband low-noise receiver and a related method.

2. Description of the Prior Art

In a wireless communication system, a broadband RF (ratio frequency) receiver is used to receive the broadband RF signal from the antenna. In the broadband RF receiver, an LNA (Low noise amplifier) is first used to amplify the extremely low broadband RF signal, and a mixer is used to down-convert the frequency of the received RF signal to generate a baseband signal. When the broadband RF signal is amplified by the LNA, linearity should be kept as ideal as possible when the broadband RF signal is amplified by the LNA. The LNA should not generate too much noise to the broadband RF signal in order to preserve the required signal-to-noise ratio (SNR) of the system at extremely low power levels. It is difficult, however, to ensure both the linearity and noise figure characteristics conforming to the required specification of the broadband RF receiver. Proper RF receiver is crucial in today's communication solutions. Due to the complexity of the signals in modern digital communications, additional design considerations need to be addressed during a broadband RF receiver design procedure.

SUMMARY OF THE INVENTION

Therefore, one objective of the present embodiment is to provide a broadband low-noise receiver and a related method.

According to a first embodiment of the present invention, a signal receiving circuit is provided. The signal receiving circuit includes an amplifier, a mixer, and a first controlling circuit. The amplifier includes: an input stage for receiving an input signal to generate a first signal; a gain stage coupled to the input stage for generating an output signal according to the first signal; and an output stage coupled to the gain stage for adjusting a spectral response of the amplifier according to a first adjusting signal. The mixer is coupled to the gain stage for generating a converted signal according to the output signal. The first controlling circuit is coupled to the mixer for detecting the converted signal to generate the first adjusting signal to adjust the spectral response of the amplifier.

According to a second embodiment of the present invention, a signal receiving method of a signal receiving circuit is provided. The signal receiving method comprises the steps: receiving an input signal to generate a first signal; using an amplifier to generate an output signal according to the first signal; generating a converted signal according to the output signal; detecting the converted signal to generate a first adjusting signal; and adjusting a spectral response of the amplifier for reducing a power of a near-end channel signal in the output signal according to the first adjusting signal.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5A is a spectrum diagram illustrating a plurality of channel powers of an input signal received by a signal receiving circuit according to another embodiment of the present invention.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
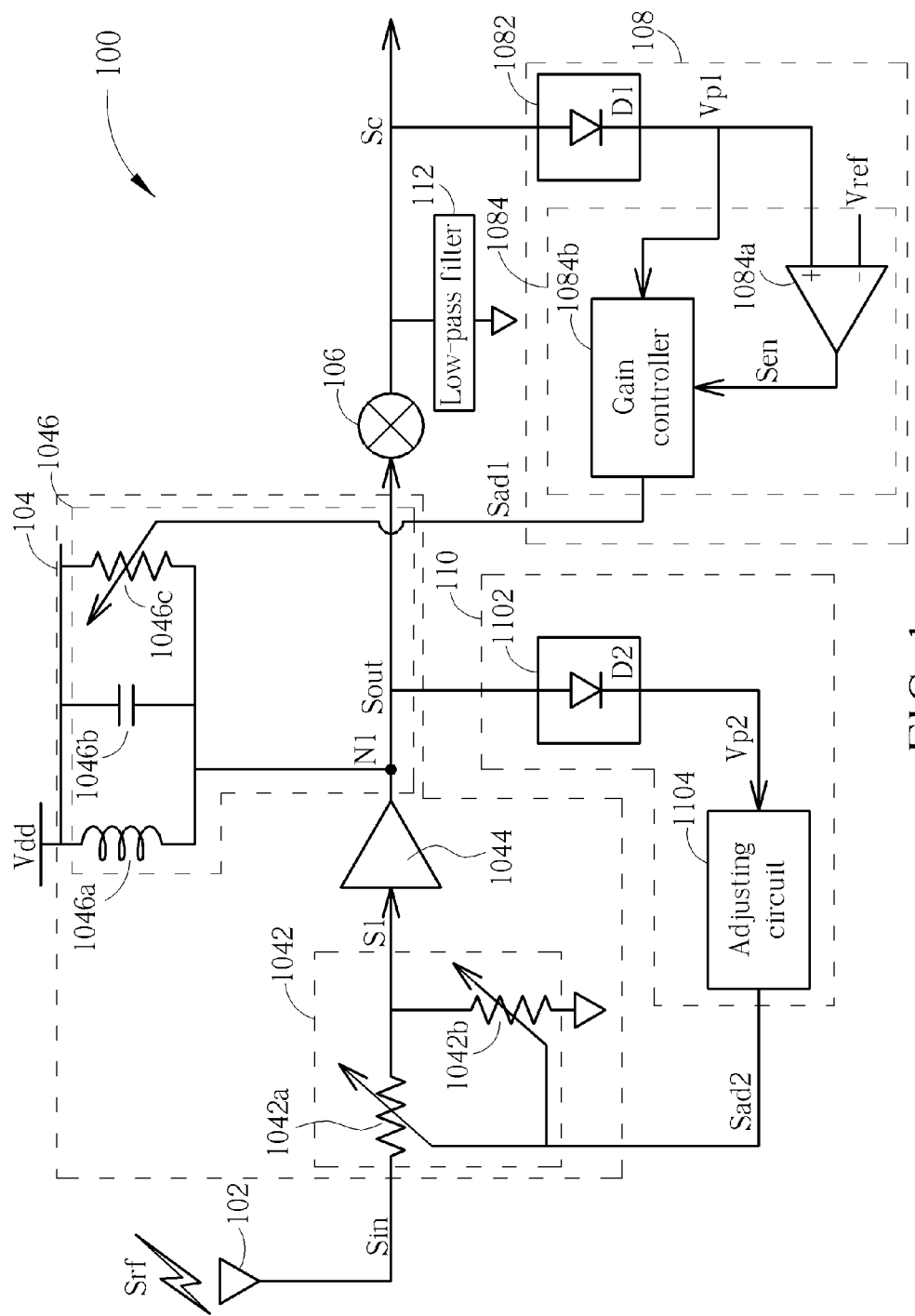
FIG. 1 is a diagram illustrating a signal receiving circuit according to an embodiment of the present invention.

Please refer to FIG. 1, which is a diagram illustrating a signal receiving circuit 100 according to an embodiment of the present invention. The signal receiving circuit 100 may be a broadband wireless receiver. The signal receiving circuit 100 comprises an amplifier 104, a mixer 106, a first controlling circuit 108, a second controlling circuit 110, and a low-pass filter 112. For descriptive purposes, an antenna 102 is also shown in FIG. 1. The amplifier 104 is a low-noise amplifier, and the amplifier 104 comprises an input stage 1042, a gain stage 1044, and an output stage 1046. The input stage 1042 is arranged for receiving an input signal Sin to generate a first signal Si. The gain stage 1044 is coupled to the input stage 1042 and is arranged for generating an output signal Sout according to the first signal S1. The output stage 1046 is coupled to the gain stage 1044 for adjusting a spectral response Ss of the amplifier 104 according to a first adjusting signal Sad1. The mixer 106 is coupled to the gain stage 1044 for generating a converted signal Sc according to the output signal Sout. The first controlling circuit 108 is coupled to the mixer 106 for detecting the converted signal Sc to generate the first adjusting signal Sad1 to selectively adjust the spectral response Ss of the amplifier 104. The second controlling circuit 110 is coupled to the gain stage 104 for detecting the output signal Sout to generate a second adjusting signal Sad2, and the second controlling circuit 110 also selectively adjusts the spectral response Ss of the amplifier 104 by using the second adjusting signal Sad2. The low-pass filter 112, which may be a capacitor, has a first terminal coupled to the output terminal of the mixer 106 and a second terminal coupled to the ground voltage Vgnd.

In this embodiment, the gain stage 1044 may be a trans-conducting circuit having an input terminal for receiving the first signal S1, and having an output terminal for outputting the output signal Sout. More specifically, the trans-conducting circuit may be an N-type field-effect transistor or a cascaded N-type field-effect transistor, in which the gate terminal of the N-type field-effect transistor (or the cascaded N-type field-effect transistor) is arranged to receive the first signal S1, and a drain terminal of the N-type field-effect transistor (or the cascaded N-type field-effect transistor) is arranged to output the output signal Sout. In addition, the terminal (i.e. N1) of the output stage 1046 may be connected to the drain terminal of the N-type field-effect transistor (or the cascaded N-type field-effect transistor). Therefore, the trans-conducting circuit provides a transferring gain upon the first signal S1 to generate the output signal Sout at the output terminal N1.

The output stage 1046 comprises an inductive circuit 1046a, a capacitive circuit 1046b, and a variable resistive circuit 1046c. The inductive circuit 1046a, such as an inductor, has a first terminal coupled to the output terminal N1 of the gain stage 1044 and a second terminal coupled to a first reference voltage, i.e., the supply voltage Vdd. The capacitive circuit 1046b, such as a capacitor, has a first terminal coupled to the output terminal N1 of the gain stage 1044 and a second terminal coupled to the supply voltage Vdd. The variable resistive circuit 1046c, such as a variable resistor, has a first terminal coupled to the output terminal N1 of the gain stage 1044 and a second terminal coupled to the supply voltage Vdd. The first controlling circuit 108 is arranged to adjust the resistance R of the variable resistive circuit 1046C for adjusting the spectral response Ss of the amplifier 104. The output stage 1046 may be a tracking filter of the signal receiving circuit 100.

The first controlling circuit 108 comprises a power detector 1082 and an adjusting circuit 1084. The power detector 1082 is arranged to detect a power of the converted signal Sc to generate a power level Vp1. The adjusting circuit 1084 is coupled to the power detector 1082 for generating the first adjusting signal Sad1 to adjust the resistance R of the variable resistive circuit 1046c according to the power level Vp1. Moreover, the power detector 1082 comprises a diode D1, wherein the diode D1 has a anode for receiving the converted signal Sc and a cathode for outputting the power level Vp1. The adjusting circuit 1084 comprises a comparator 1084a and a gain controller 1084b. The comparator 1084a has a first input terminal (i.e. the non-inverting node "+") coupled to the power level Vp1, a second input terminal (i.e. the inverting node "−") coupled to a reference level Vref, and an output terminal for outputting an enable signal Sen. The gain controller 1084b is coupled to the diode D1 and the comparator 1084a. When the enable signal Sen indicates that the power level Vp1 is larger than the reference level Vref, the gain controller 1084b generates the first adjusting signal Sad1 to adjust the resistance R of the variable resistive circuit 1046c according to the power level Vp1. It should be noted that the power detector 1082 is a narrowband power detector used for detecting the baseband power of the converted signal Sc because the converted signal Sc is a narrow band signal after being filtered by the tracking filter (i.e. 1046), the mixer 106 and the low-pass filter 112.

The input stage 1042 comprises at least a first variable resistive circuit 1042a and a second variable resistive circuit 1042b, in which the first variable resistive circuit 1042a and the second variable resistive circuit 1042b are variable resistors. The input stage 1042 may also be an attenuator. The second controlling circuit 110 comprises a power detector 1102 and an adjusting circuit 1104. The power detector 1102 is arranged to detect the power of the output signal Sout to generate a power level Vp2. The adjusting circuit 1104 is coupled to the power detector 1102 for generating the second adjusting signal Sad2 to adjust the resistance of the variable resistive circuit 1042 according to the power level Vp2. More specifically, the adjusting circuit 1104 uses the second adjusting signal Sad2 to adjust the resistances of the first variable resistive circuit 1042a and the second variable resistive circuit 1042b. The power detector 1102 may be a diode D2 having an anode for receiving the output signal Sout and a cathode for outputting the power level Vp2. The adjusting circuit 1104 comprises a gain controller coupled to the diode D2 for generating the second adjusting signal Sad2 to adjust the resistance of the variable resistive circuit 1042a, 1042b according to the power level Vp2. It should be noted that the power detector 1102 is a broadband power detector used for detecting the RF power of the output signal Sout because the output signal Sout has not been filtered by the mixer 106 and the low-pass filter 112.

Figure 2:
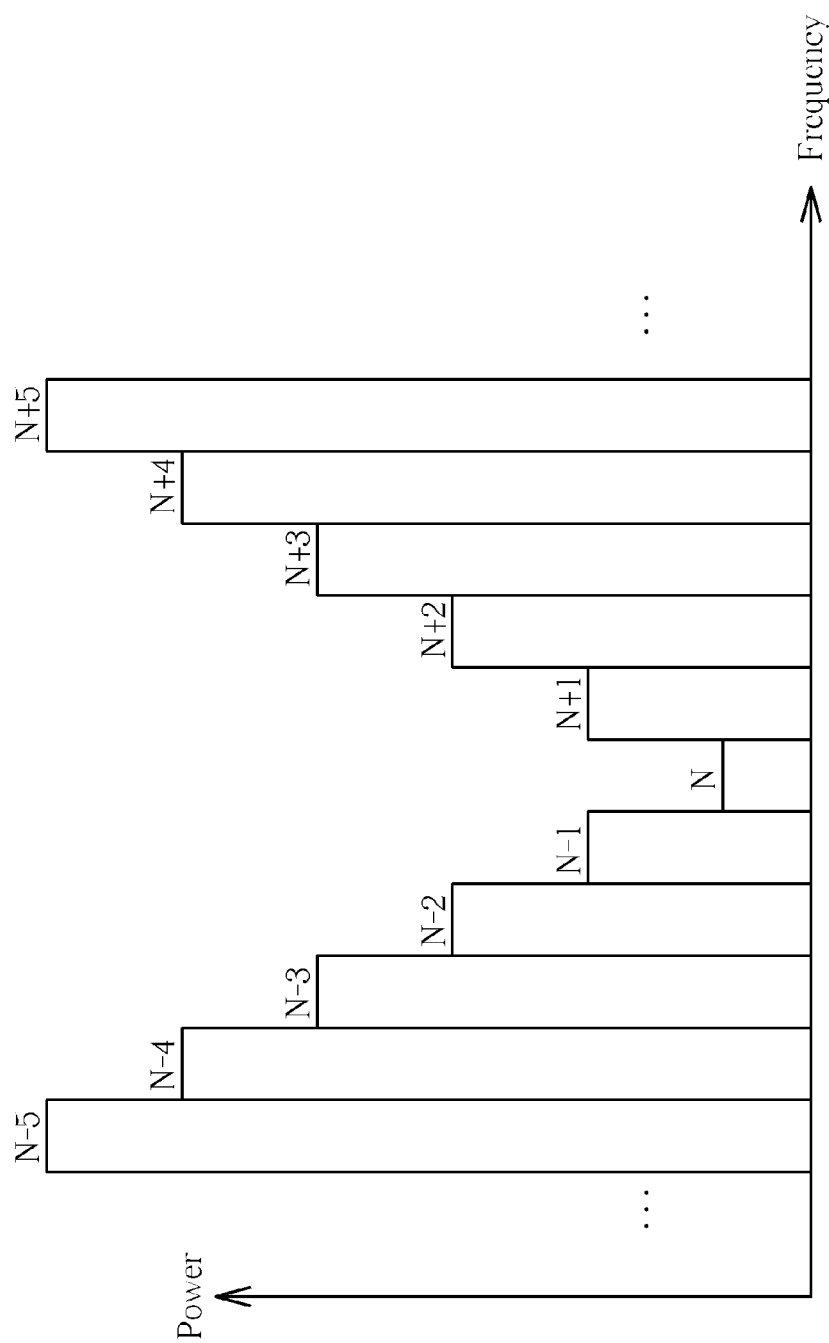
FIG. 2 is a spectrum diagram illustrating a plurality of channel powers of an input signal received by a signal receiving circuit according to an embodiment of the present invention.

Please refer to FIG. 2, which is a spectrum diagram illustrating a plurality of channel powers of the input signal Sin received by the signal receiving circuit 100, in which the target channel is labeled as N, and the plurality of nearby channels are labeled as N−5, N−4, N−3, N−2, N−1, N+1, N+2, N+3, N+4, N+5 respectively. It is noted that the nearby channels N−5, N−4, N−3, N−2, N−1, N+1, N+2, N+3, N+4, N+5 may include the near-end channels and the far-end channels corresponding to the target channel N. Moreover, the required signal in the target channel N is assumed to have the lowest power among the plurality of channels N−5, N−4, N−3, N−2, N−1, N, N+1, N+2, N+3, N+4, N+5. Therefore, in designing the signal receiving circuit 100, the signal in the target channel N is assumed to be easily affected by the power of the signals (e.g. interference) in the nearby channels N−5, N−4, N−3, N−2, N−1, N+1, N+2, N+3, N+4, N+5. Therefore, the signals in the nearby channels N−5, N−4, N−3, N−2, N−1, N+1, N+2, N+3, N+4, N+5 should be suppressed before the baseband signal (i.e. the converted signal Sc) is processed in order to improve the noise figure (SNR) and the linearity of the wireless system.

According to the present embodiment signal receiving circuit 100, the first controlling circuit 108 and the second controlling circuit 110 do not always turn-on during the operation. The first controlling circuit 108 is only turned on when the near-end interference in the output signal Sout is similar to or larger than the far-end interference in the output signal Sout. The second controlling circuit 110 is only turned on when the far-end interference in the output signal Sout is larger than the near-end interference in the output signal Sout. In other words, the first controlling circuit 108 is arranged to deal with the near-end interference of the input signal Sin, and the second controlling circuit 110 is arranged to deal with the far-end interference of the input signal Sin. For descriptive purposes, the far-end interference is defined as the interferences appeared on the channels N−5, N−4, N−3, N−2, N+2, N+3, N+4, N+5, and the near-end interference is defined as the interferences appeared on the channels N−1, N+1. However, this is not a limitation of the present invention.

Figure 3A:
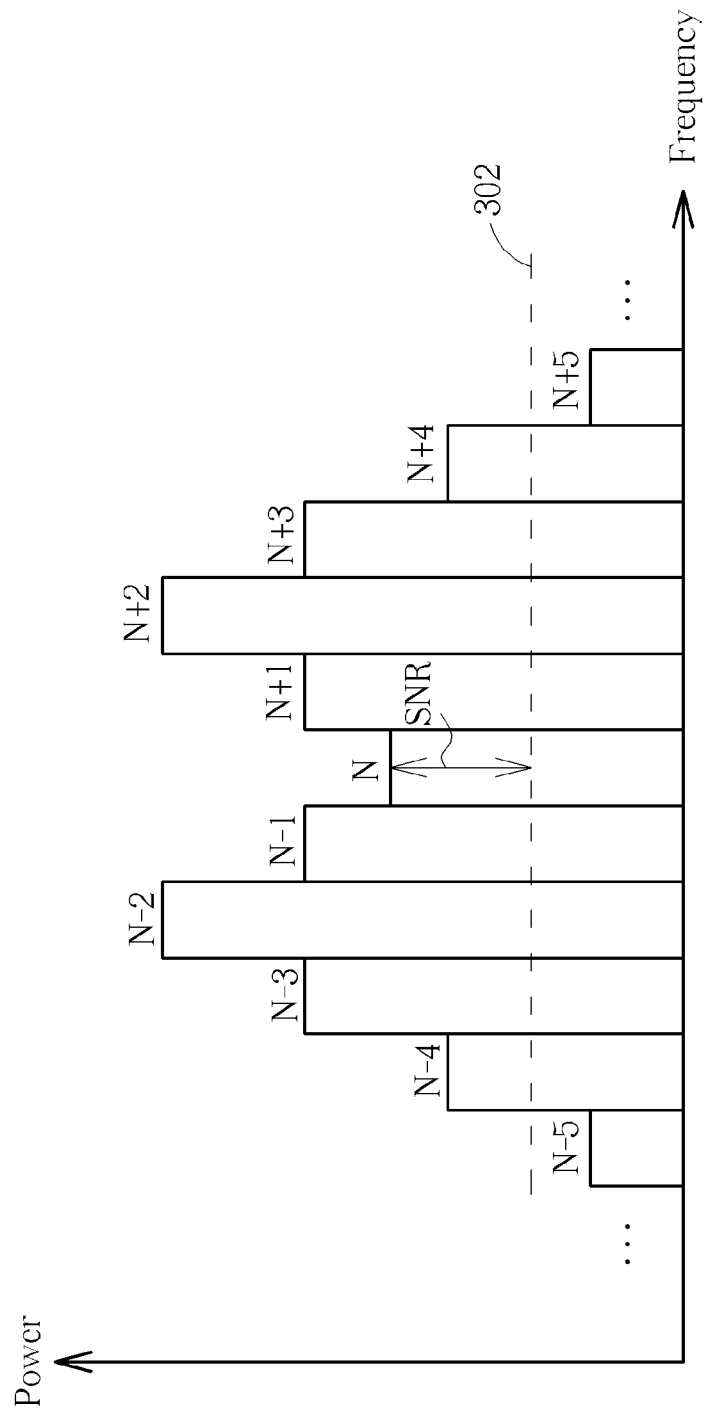
FIG. 3A is a spectrum diagram of a plurality of nearby channels and a target channel of an output signal when both a first controlling circuit and a second controlling circuit are disabled.

When the signal receiving circuit 100 is turned on to receive a wideband interference signal (i.e. the input signal Sin), both the first controlling circuit 108 and the second controlling circuit 110 are disable initially, and the preset low noise amplifier (which comprises the input stage 1042, the gain stage 1044, and the output stage 1046) is first used to filter-out the large amount of far-end signal of the input signal Sin to generate the output signal Sout. Afterward, if the far-end interference in the output signal Sout is larger than the near-end interference in the output signal Sout, the second controlling circuit 110 is then turned on for adjusting the output signal Sout. Please refer to FIG. 3A, which is a spectrum diagram of the plurality of nearby channels N−5, N−4, N−3, N−2, N−1, N+1, N+2, N+3, N+4, N+5 and the target channel N of the output signal Sout when both the first controlling circuit 108 and the second controlling circuit 110 are disabled. It can be seen that, in this case, the power of the far-end channels N−2, N+2 is larger than the power of the near-end channels N−1, N+1. Then, the power detector 1102 outputs the power level Vp2 to the adjusting circuit 1104. In other words, when the power detector 1102 determines the power of the far-end channels N−2, N+2 is larger than the power of the near-end channels N−1, N+1, the power detector 1102 generates the power level Vp2 to enable the adjusting circuit 1104. It should be noted that the power detector 1102 shown in FIG. 1 is just a simplified version of power detector. One ordinary skill in the art is appreciated to understand the power detector 1102 may also comprise other circuit components installed therein to perform the above mentioned power determining process. The detailed description of the power detector 1102 is omitted here for brevity.

Figure 3B:
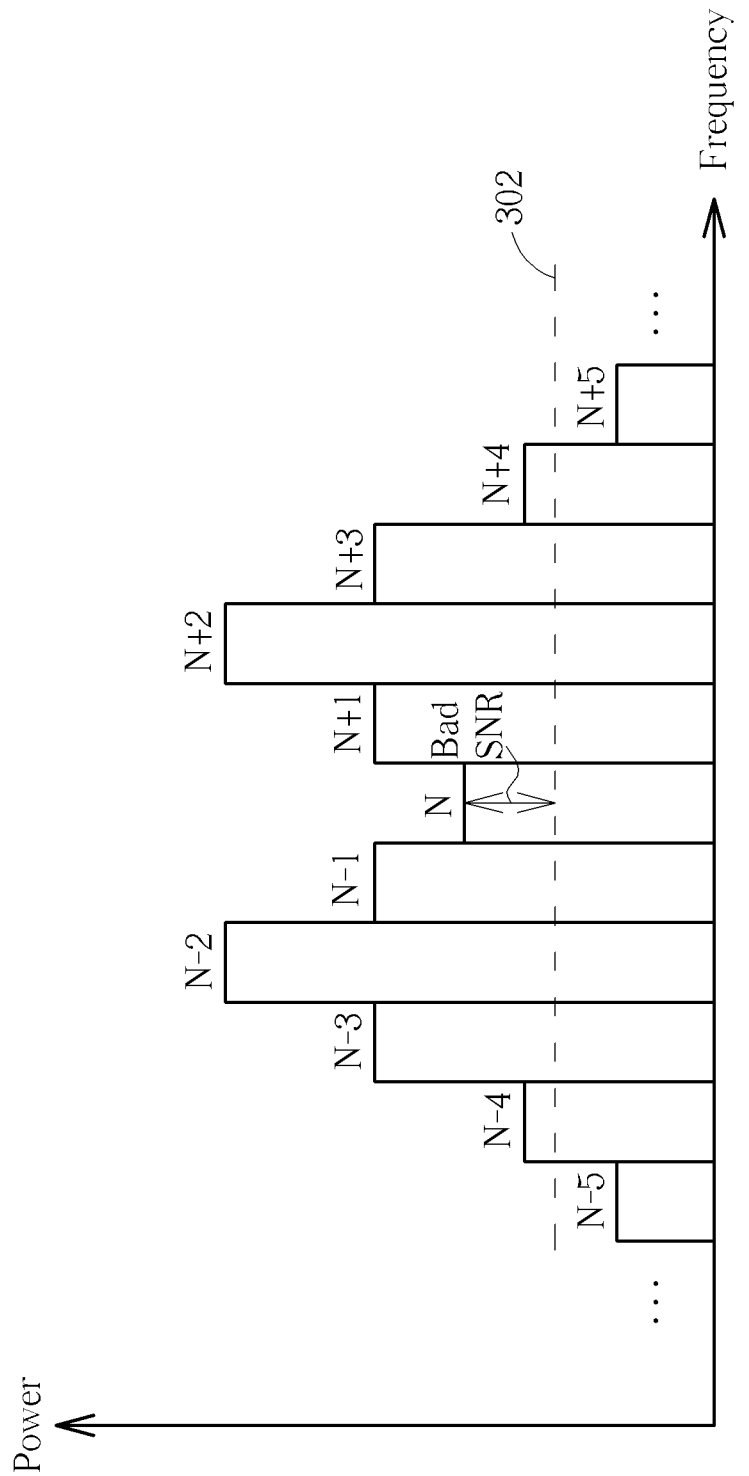
FIG. 3B is a spectrum diagram of a plurality of nearby channels and a target channel of an output signal when a second controlling circuit is enabled and a first controlling circuit is disabled.

Then, the adjusting circuit 1104 generates the second adjusting signal Sad2 to adjust the resistance of the variable resistive circuit 1042 according to the power level Vp2. More specifically, the adjusting circuit 1104 may reduce the gain of the low-noise amplifier to simultaneously reduce the signal power on the plurality of nearby channels N−5, N−4, N−3, N−2, N−1, N+1, N+2, N+3, N+4, N+5 and the target channel N as shown in FIG. 3B, which is a spectrum diagram of the plurality of nearby channels N−5, N−4, N−3, N−2, N−1, N+1, N+2, N+3, N+4, N+5 and the target channel N of the output signal Sout when the second controlling circuit 110 is enabled and the first controlling circuit 108 is disabled. It can be seen that, in this case, the signal powers on the plurality of nearby channels N−5, N−4, N−3, N−2, N−1, N+1, N+2, N+3, N+4, N+5 and the target channel N is simultaneously reduced but the noise level (i.e. the dashed line 302 in FIG. 3A and FIG. 3B) remains unchanged. It is noted that the signal-to-noise ratio (SNR) of the output signal Sout is degraded if the noise level in the output signal Sout remains unchanged but the signal power on the target channel N is reduced. In other words, by using the second controlling circuit 110 to adjust the variable resistive circuit 1042 for improving the linearity, the user should deal with the trade off between the linearity and the SNR of the output signal Sout.

Figure 4:
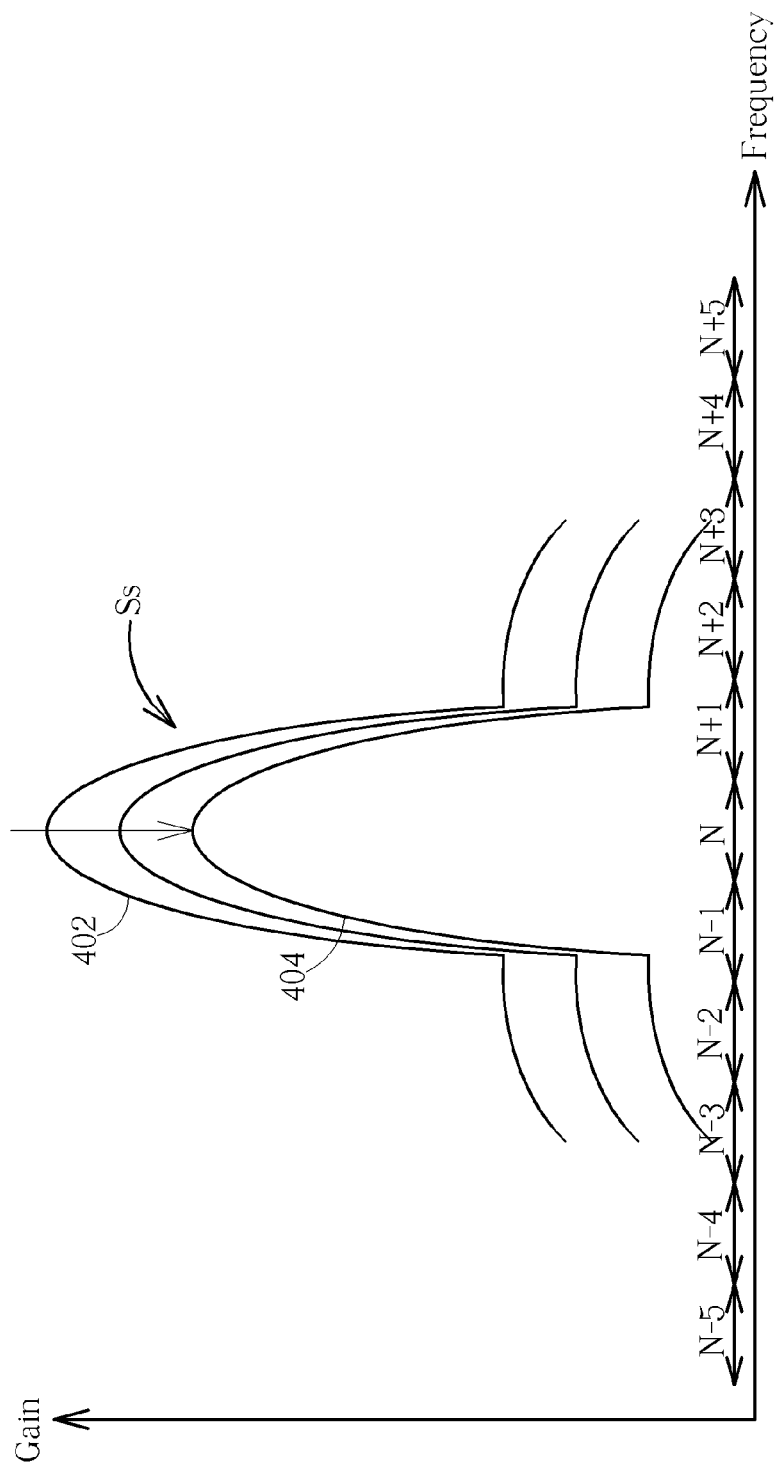
FIG. 4 is a diagram illustrating a spectral response from an input signal to an output signal before and after a second controlling circuit is enabled.

Moreover, please refer to FIG. 4, which is a diagram illustrating the spectral response Ss from the input signal Sin to the output signal Sout before and after the second controlling circuit 110 is enabled, in which the curve 402 represents the spectral response Ss from the input signal Sin to the output signal Sout before the second controlling circuit 110 is enabled, and the curve 404 represents the spectral response Ss from the input signal Sin to the output signal Sout after the second controlling circuit 110 is enabled. It can be seen that the gains on the nearby channels N−5, N−4, N−3, N−2, N−1, N+1, N+2, N+3, N+4, N+5 and the target channel N are simultaneously reduced by the second controlling circuit 110 when the resistance of the variable resistors in the input stage 1042 is adjusted. It is noted that, the power of the wanted signal mainly falls in the maximum response area of the spectral response Ss.

According to FIG. 4, the gains on the spectral response Ss are simultaneously adjusted by the adjusting circuit 1104. For example, when the adjusting circuit 1104 reduces the resistance of the variable resistors in the input stage 1042, the gains in the target channels N and the nearby channels N−5, N−4, N−3, N−2, N−1, N+1, N+2, N+3, N+4, N+5 are decreased simultaneously, i.e. from the curve 402 to the curve 404. In another example, when the adjusting circuit 1104 increases the resistance of the variable resistors in the input stage 1042, the gains in the target channels N and the nearby channels N−5, N−4, N−3, N−2, N−1, N+1, N+2, N+3, N+4, N+5 are increased simultaneously. Accordingly, the power of signals in the near-end channels and the far-end channels of the target channel N are adjusted. By doing this, the interference from the near-end channels and the far-end channels can be reduced, and the linearity of the wanted signal (i.e. the signal in the target channel N) in the output signal Sout can be optimized. However, the SNR is degraded as mentioned in above paragraph.

It is noted that the adjusting circuit 1104 may also be an automatic gain controller. The automatic gain controller refers the power level Vp2 to adjust the spectral response Ss from the input signal Sin to the output signal Sout until the linearity of the output signal Sout is optimized.

Figure 5B:
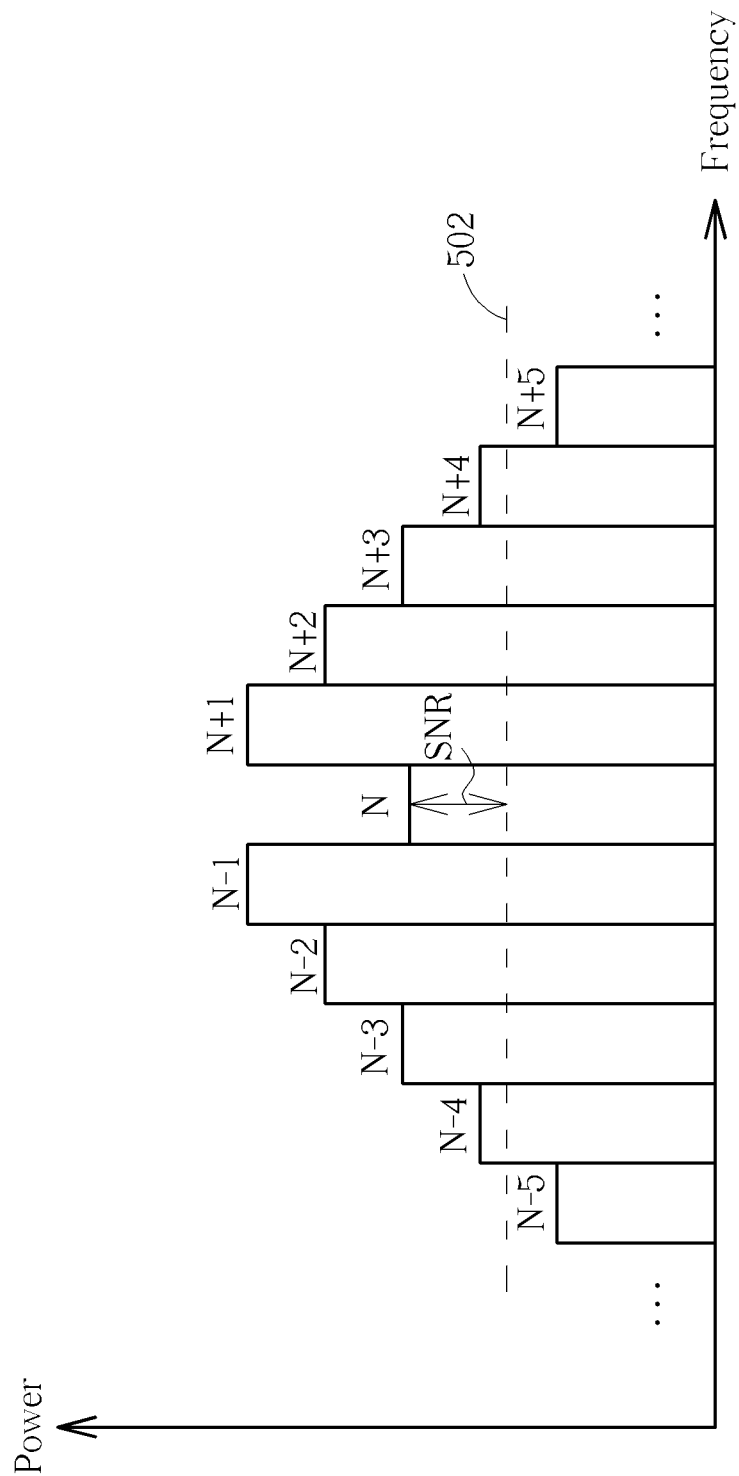
FIG. 5B is a spectrum diagram illustrating a plurality of nearby channels and a target channel of an output signal when both a first controlling circuit and a second controlling circuit are disabled according to another embodiment of the present invention.
Figure 5C:
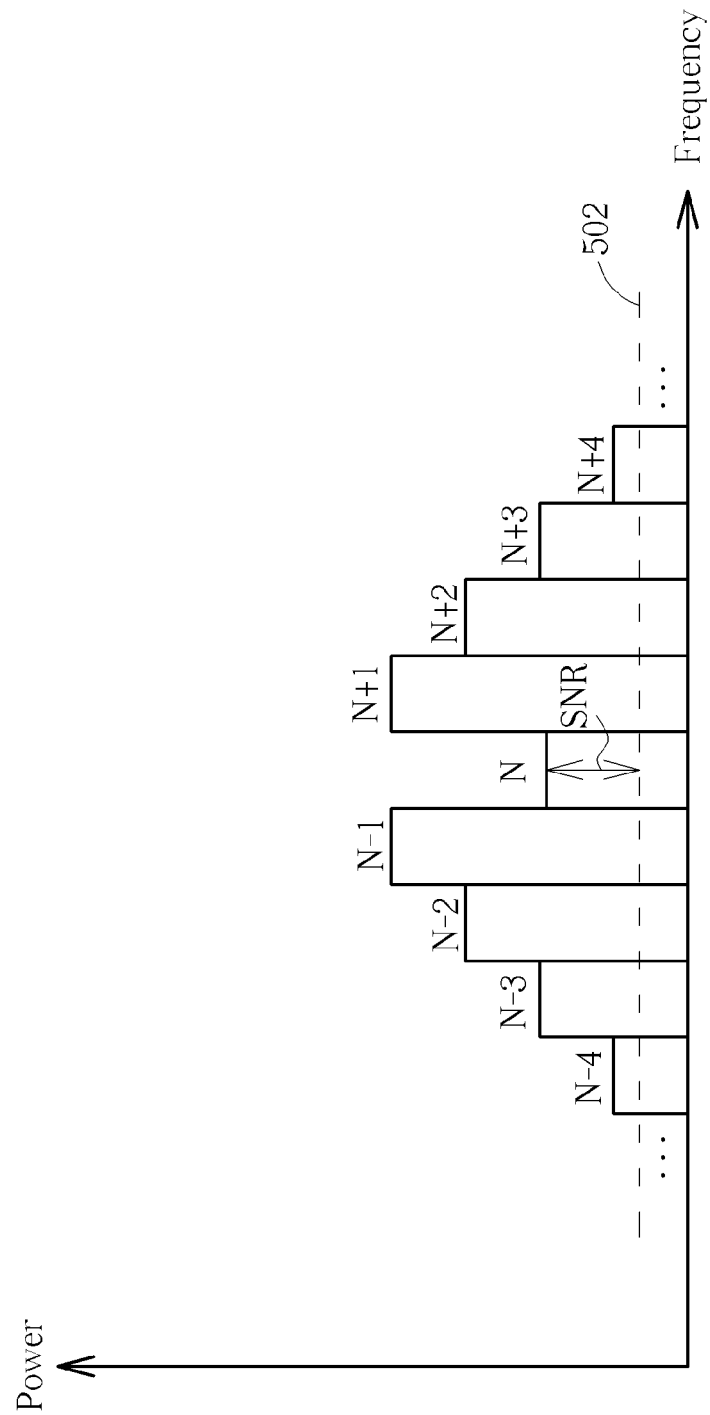
FIG. 5C is a spectrum diagram illustrating a plurality of nearby channels and a target channel of an output signal when a first controlling circuit 108 is enabled and a second controlling circuit is disabled.

However, if the near-end interference in the output signal Sout is similar to or larger than the far-end interference in the output signal Sout, the first controlling circuit 108 is turned on. More specifically, regarding to the input signal Sin, if the powers of the near-end channels N−1, N+1 of the input signal Sin is larger than the power of the far-end channels N−2, N+2 of the input signal Sin, then the powers of the near-end channels N−1, N+1 of the output signal Sout may larger than the power of the far-end channels N−2, N+2 of the output signal Sout. When this happens, the first controlling circuit 108 will be turned on to adjust the gain of the low-noise amplifier via the output stage 1046. Please refer to FIG. 5A-5C. FIG. 5A is a spectrum diagram illustrating a plurality of channel powers of the input signal Sin received by the signal receiving circuit 100 according to another embodiment of the present invention, in which the target channel is labeled as N, and the plurality of nearby channels are labeled as N−5, N−4, N−3, N−2, N−1, N+1, N+2, N+3, N+4, N+5 respectively. FIG. 5B is a spectrum diagram illustrating the plurality of nearby channels N−5, N−4, N−3, N−2, N−1, N+1, N+2, N+3, N+4, N+5 and the target channel N of the output signal Sout when both the first controlling circuit 108 and the second controlling circuit 110 are disabled. FIG. 5C is a spectrum diagram illustrating the plurality of nearby channels N−5, N−4, N−3, N−2, N−1, N+1, N+2, N+3, N+4, N+5 and the target channel N of the output signal Sout when the first controlling circuit 108 is enabled and the second controlling circuit 110 is disabled.

Similarly, the signal in the target channel N is assumed to have the lowest power among the plurality of channels N−5, N−4, N−3, N−2, N−1, N, N+1, N+2, N+3, N+4, N+5. However, in this case, the powers of the near-end channels N−1, N+1 is larger than the power of the far-end channels N−2, N+2. Again, the signals in the nearby channels N−5, N−4, N−3, N−2, N−1, N+1, N+2, N+3, N+4, N+5 should be suppressed before the baseband signal (i.e. the converted signal Sc) is processed in order to improve the SNR of the wireless system. The preset low noise amplifier (which comprises the input stage 1042, the gain stage 1044, and the output stage 1046) is first used to filter-out the large amount of far-end signal of the input signal Sin to generate the output signal Sout. Then, the first controlling circuit 108 is enabled to deal with the near-end interference in the output signal Sout. It is noted that the noise level (i.e. the dashed line 502) is also shown in FIG. 5B.

According to the embodiment, when the output signal Sout is mixed by a carrier signal via the mixer 106 and is low-passed by the low-pass filter 112, the output signal Sout is down-converted to the baseband signal, i.e. the converted signal Sc. It should be noted that the low-pass filter 112 in conjunction with the mixer 106 is also arranged to filter out the signals in the far-end channels N−5, N−4, N−3, N−2, N+2, N+3, N+4, N+5 of the output signal Sout. Thus, only the signals in the channels N−1, N, N+1 is passed to the power detector 1082. Then, the power detector 1082 detects the power of the converted signal Sc to generate the power level Vp1. The comparator 1084a compares the power level Vp1 to the reference level Vref. If the power level Vp1 is higher than the reference level Vref, which means that the near-end interference in the output signal Sout is larger than the far-end interference in the output signal Sout, the comparator 1084a outputs the enable signal Sen to enable the gain controller 1084b. Then, the gain controller 1084b adjusts the resistance R of the variable resistive circuit 1046c according to the power level Vp1. It should be noted that the power detector 1082 shown in FIG. 1 is just a simplified version of power detector. One ordinary skill in the art is appreciated to understand the power detector 1082 may also comprise other circuit components installed therein to perform the above mentioned power determining process. The detailed description of the power detector 1082 is omitted here for brevity.

According to FIG. 5B, it can be seen that the power of the near-end channels N−1, N+1 of the output signal Sout is larger than the power of the far-end channels N−2, N+2 of the output signal Sout. Then, the first controlling circuit 108 is enabled to adjust the quality of the tracking filter (i.e. the output stage 1046) according to the power level Vp1. In other words, the gain controller 1084b reduces the gain of the low-noise amplifier to simultaneously reduce the signal power on the plurality of nearby channels N−5, N−4, N−3, N−2, N−1, N+1, N+2, N+3, N+4, N+5 and the target channel N as shown in FIG. 5C. Accordingly, the powers on the plurality of nearby channels N−5, N−4, N−3, N−2, N−1, N+1, N+2, N+3, N+4, N+5, the target channel N, and the noise level (i.e. the dashed line 504) are reduced simultaneously due to the gain reduction of the low-noise amplifier as shown in FIG. 5C. Therefore, the linearity of the output signal Sout is improved while the signal-to-noise ratio (SNR) of the output signal Sout is kept intact. In other words, by using the first controlling circuit 108 to adjust the gain of the low-noise amplifier, the user does not need to deal with the trade off between the linearity and the noise figure of the output signal Sout. This is because the power of the target channel N and the noise level (i.e. the dashed line 504) are reduced simultaneously.

Figure 6:
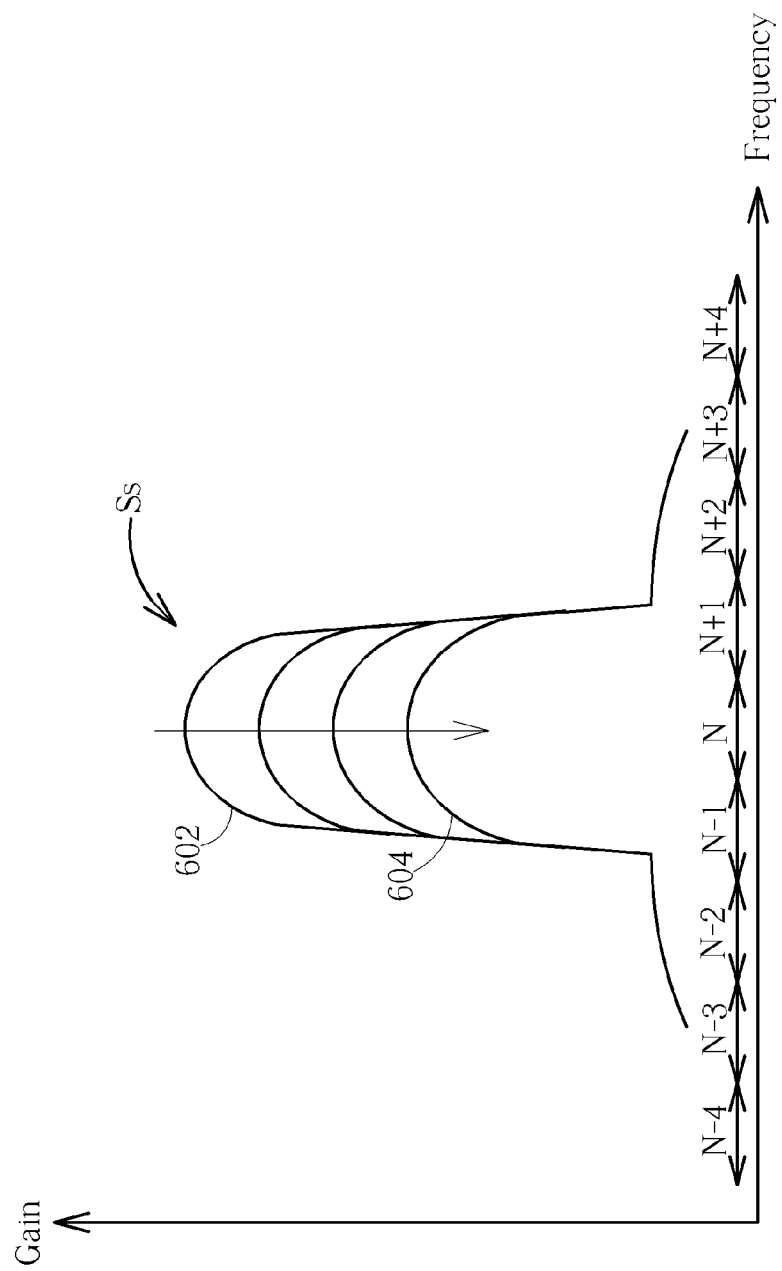
FIG. 6 is a diagram illustrating a spectral response from an input signal to an output signal before and after a first controlling circuit is enabled.

Moreover, please refer to FIG. 6, which is a diagram illustrating the spectral response Ss from the input signal Sin to the output signal Sout before and after the first controlling circuit 108 is enabled, in which the curve 602 represents the spectral response Ss from the input signal Sin to the output signal Sout before the first controlling circuit 108 is enabled, and the curve 604 represents the spectral response Ss from the input signal Sin to the output signal Sout after the first controlling circuit 108 is enabled. According to FIG. 6, it can be seen that when the resistance R of the variable resistive circuit 1046c is adjusted, only the gains for the target channel N and the near-end channels (e.g. N−1, N+1) are adjusted, and the gains for the far-end channels (e.g. N−3 and N+3) are substantially kept intact. In other words, in this embodiment, the first controlling circuit 108 is arranged to reduce the gains for the target channel N and the near-end channels adjacent to the target channel N until the power of the signal (i.e. the wanted signal) in the target channel N reaches a predetermined power. For example, when the gain controller 1084b reduces the resistance of the variable resistors in the output stage 1046, the gains for the target channels N and the near-end channels N−1, N+1 are decreased simultaneously while the gains for the far-end channels N−3, N+3 are kept intact, i.e. from the curve 602 to the curve 604.

Therefore, by reducing the gains for the target channel N and the near-end channels, the SNR of the signal receiving circuit 100 may be kept intact while the interference in the near-end channels adjacent to the target channel N is reduced. In other words, by using the present the first controlling circuit 108, the gains for the near-end channels adjacent to the target channel N is reduced while the SNR of the signal receiving circuit 100 is kept intact. Therefore, the linearity of the signal receiving circuit 100 is improved.

It is noted that the gain controller 1084b may also be an automatic gain controller. The automatic gain controller refers the power level Vp1 to adjust the maximum response area in the spectral response Ss from the input signal Sin to the output signal Sout until the power of the signals in the near-end channels is minimized.

Figure 7:
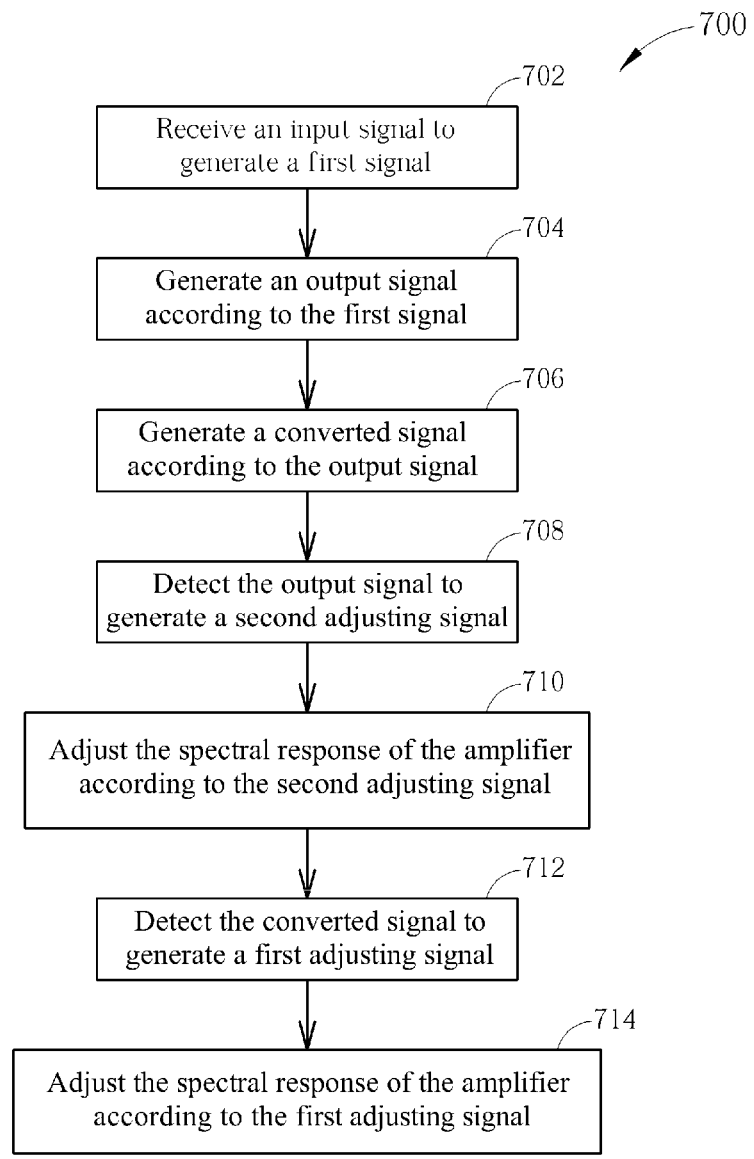
FIG. 7 is a flowchart illustrating a signal receiving method applicable in a signal receiving circuit according to an embodiment of the present invention.

In view of the above description of the present signal receiving circuit 100, the method of achieving good linearity and good noise figure (e.g. SNR) can be briefly summarized into the steps shown in FIG. 7. FIG. 7 is a flowchart illustrating a signal receiving method 700 applicable in the signal receiving circuit 100 according to an embodiment of the present invention. Provided that substantially the same result is achieved, the steps of the flowchart shown in FIG. 7 need not be in the exact order shown and need not be contiguous; that is, other steps can be intermediate. The signal receiving method 700 comprises:

Step 702: Receive the input signal Sin to generate the first signal S1;

Step 704: Use the amplifier 104 to generate the output signal Sout according to the first signal S1;

Step 706: Generate the converted signal Sc according to the output signal Sout;

Step 708: Detect the output signal Sout to generate the second adjusting signal Sad2;

Step 710: Adjust the spectral response Ss of the amplifier 104 for reducing a power of a far-end channel signal in the output signal Sout to adjust the linearity of the output signal Sout according to the second adjusting signal Sad2;

Step 712: Detect the converted signal Sc to generate the first adjusting signal Sad1; and Step 714: Adjust the spectral response Ss of the amplifier 104 for reducing the power of the signals in the near-end channels adjacent to the target channel N according to the first adjusting signal Sad1.

It is noted that the steps 702-714 summarize the inventive steps of the present signal receiving circuit 100, thus the detailed description of the signal receiving method 700 is omitted here for brevity.

Briefly, by arranging the first controlling circuit 108 to adjust the power of the signals in the target channel N and the near-end channels of the output signal Sout, the noise figure (e.g. SNR) of the signal receiving circuit 100 may be kept intact while the power of the signals in the near-end channels adjacent to the target channel N is reduced. Moreover, by arranging the second controlling circuit 110 to adjust the power of the signals in the target channel N, the near-end channel, and the far-end channel in the input signal Sin, the interferences of the near-end channel and the far-end channel can be reduced and the linearity of the wanted signal in the output signal Sout can be optimized. Thus, the present broadband signal receiving circuit 100 achieves better noise figure and linearity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal receiving circuit, comprising:
    an amplifier, comprising:
        an input stage, for receiving an input signal to generate a first signal;
        a gain stage, coupled to the input stage, for generating an output signal according to the first signal; and
        an output stage, coupled to the gain stage, for adjusting a spectral response of the amplifier according to a first adjusting signal;
    a mixer, coupled to the gain stage, for generating a converted signal according to the output signal; and
    a first controlling circuit, coupled to the mixer, for detecting the converted signal to generate the first adjusting signal to adjust the spectral response of the amplifier;
    wherein the gain stage comprises:
    a trans-conducting circuit, for providing a transferring gain upon the first signal to generate the output signal at an output terminal of the gain stage;
    the output stage comprises:
    an inductive circuit, having a first terminal coupled to the output terminal of the gain stage and a second terminal coupled to a first reference voltage;
    a capacitive circuit, having a first terminal coupled to the output terminal of the gain stage and a second terminal coupled to the first reference voltage; and
    a variable resistive circuit, having a first terminal coupled to the output terminal of the gain stage and a second terminal coupled to the first reference voltage;
    wherein the first controlling circuit is arranged to adjust a resistance of the variable resistive circuit for adjusting the spectral response of the amplifier.

2. The signal receiving circuit of claim 1, wherein the first controlling circuit generates the first adjusting signal to adjust the spectral response of the amplifier for reducing a power of a near-end channel signal in the output signal.

3. The signal receiving circuit of claim 1, wherein the first controlling circuit generates the first adjusting signal to simultaneously reduce a noise level of the amplifier and the power of a wanted signal in the output signal.

4. The signal receiving circuit of claim 1, further comprising:
    a low-pass filter, having a first terminal coupled to an output terminal of the mixer and a second terminal coupled to a reference voltage, arranged to low-pass the converted signal;
    wherein the converted signal is output at the output terminal of the mixer.

5. The signal receiving circuit of claim 1, wherein the amplifier is a low-noise amplifier.

6. The signal receiving circuit of claim 1, wherein the converted signal is a baseband signal.

7. The signal receiving circuit of claim 1, wherein the first controlling circuit comprises:
    a power detector, arranged to detect a power of the converted signal to generate a power level; and
    an adjusting circuit, coupled to the power detector, for generating the first adjusting signal to adjust the resistance of the variable resistive circuit.

8. The signal receiving circuit of claim 7, wherein the power detector is a narrowband power detector.

9. The signal receiving circuit of claim 7, wherein the power detector comprises:
    a diode, having an anode for receiving the converted signal and a cathode for outputting the power level; and
    the adjusting circuit comprises:
    a comparator, having a first input terminal coupled to the power level, a second input terminal coupled to a reference level, and an output terminal for outputting an enable signal; and
    a gain controller, coupled to the diode and the comparator, wherein when the enable signal indicates that the power level is larger than the reference level, the gain controller generates the first adjusting signal to adjust the resistance of the variable resistive circuit according to the power level.

10. The signal receiving circuit of claim 7, wherein the gain controller adjusts the resistance of the variable resistive circuit according to the power level until the enable signal indicates that the power level is not larger than the reference level.

11. The signal receiving circuit of claim 1, further comprising:
    a second controlling circuit, coupled to the gain stage, for detecting the output signal to generate a second adjusting signal;
    wherein the second controlling circuit adjusts the spectral response of the amplifier by using the second adjusting signal.

12. The signal receiving circuit of claim 11, wherein the second controlling circuit generates the second adjusting signal to adjust the spectral response of the amplifier for reducing a power of a far-end channel signal in the output signal.

13. The signal receiving circuit of claim 11, wherein the input stage comprises a variable resistive circuit, and the second controlling circuit comprises:
    a power detector, arranged to detect a power of the output signal to generate a power level;
    an adjusting circuit, coupled to the power detector, for generating the second adjusting signal to adjust a resistance of the variable resistive circuit according to the power level.

14. The signal receiving circuit of claim 13, wherein the power detector is a broadband power detector.

15. The signal receiving circuit of claim 13, wherein the power detector comprises:
    a diode, having an anode for receiving the output signal and a cathode for outputting a power level; and the adjusting circuit comprises:
a gain controller, coupled to the diode, for generating the second adjusting signal to adjust the resistance of the variable resistive circuit according to the power level.

16. A signal receiving method applicable in a signal receiving circuit, comprising:
receiving an input signal to generate a first signal;
using an amplifier to provide a transferring gain upon the first signal to generate an output signal;
generating a converted signal according to the output signal;
detecting the converted signal to generate a first adjusting signal;
adjusting a spectral response of the amplifier for reducing a power of a near-end channel signal in the output signal according to the first adjusting signal, comprising:
providing an inductive circuit to couple between the output signal and a first reference voltage;
providing a capacitive circuit to couple between the output signal and the first reference voltage;
providing a variable resistive circuit to couple between the output signal and the first reference voltage; and
adjusting a resistance of the variable resistive circuit for adjusting the spectral response of the amplifier.

17. The signal receiving method of claim 16, further comprising:
detecting the output signal to generate a second adjusting signal; and
adjusting the spectral response of the amplifier for reducing a power of a far-end channel signal in the output signal according to the second adjusting signal.

* * * * *